(12) United States Patent
Kang et al.

(10) Patent No.: US 9,088,009 B2
(45) Date of Patent: Jul. 21, 2015

(54) RESIN COMPOSITION, OPTICAL FILM AND ORGANIC LIGHT EMITTING DISPLAY DEVICE

(71) Applicant: LG CHEM, LTD., Seoul (KR)

(72) Inventors: Byoung-Il Kang, Daejeon (KR); Chang-Hun Han, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/130,392

(22) PCT Filed: Sep. 23, 2013

(86) PCT No.: PCT/KR2013/008498
§ 371 (c)(1),
(2) Date: Dec. 31, 2013

(87) PCT Pub. No.: WO2014/157791
PCT Pub. Date: Oct. 2, 2014

(65) Prior Publication Data
US 2015/0084007 A1  Mar. 26, 2015

(30) Foreign Application Priority Data

Mar. 28, 2013 (KR) .................. 10-2013-0033790
Sep. 23, 2013 (KR) .................. 10-2013-0112585

(51) Int. Cl.
| | | |
|---|---|---|
| *H01L 35/24* | (2006.01) | |
| *H01L 51/00* | (2006.01) | |
| *H01L 51/52* | (2006.01) | |
| *G02B 5/20* | (2006.01) | |
| *G02B 1/04* | (2006.01) | |
| *C08F 220/18* | (2006.01) | |
| *C08F 220/08* | (2006.01) | |

(52) U.S. Cl.
CPC .......... *H01L 51/5284* (2013.01); *C08F 220/08* (2013.01); *C08F 220/18* (2013.01); *G02B 1/04* (2013.01); *G02B 5/208* (2013.01); *H01L 51/5271* (2013.01); *H01L 51/5293* (2013.01)

(58) Field of Classification Search
CPC .................................. B32B 7/02; H01L 35/24
USPC ............................................. 257/40; 428/212
See application file for complete search history.

(56) References Cited

U.S. PATENT DOCUMENTS

| | | | |
|---|---|---|---|
| 6,812,983 B2 | 11/2004 | Arakawa | |
| 2002/0005925 A1 | 1/2002 | Arakawa | |
| 2003/0040555 A1* | 2/2003 | Sakabe | 523/335 |
| 2006/0122327 A1* | 6/2006 | Lester | 525/71 |
| 2011/0135911 A1* | 6/2011 | Maenaka et al. | 428/327 |
| 2011/0171441 A1 | 7/2011 | Choi et al. | |

FOREIGN PATENT DOCUMENTS

| | | |
|---|---|---|
| KR | 10-2001-0105255 A | 11/2001 |
| KR | 1020010105255 A | 11/2001 |
| KR | 10-2009-0067104 A | 6/2009 |
| KR | 1020090067104 A | 6/2009 |
| KR | 10-2010-0066477 A | 6/2010 |
| KR | 1020100066477 A | 6/2010 |
| KR | 10-2010-0081918 A | 7/2010 |
| KR | 1020100081918 A | 7/2010 |
| KR | 10-2010-0104519 A | 9/2010 |
| KR | 1020100104519 A | 9/2010 |

* cited by examiner

*Primary Examiner* — Phuc Dang
(74) *Attorney, Agent, or Firm* — McKenna Long & Aldridge, LLP

(57) ABSTRACT

The present disclosure relates to a resin composition comprising a copolymer including: (A) 100 parts by weight of units derived from a polycyclic aromatic monomer including a vinyl group, (B) 100 to 600 parts by weight of units derived from a styrene monomer, (C) 100 to 600 parts by weight of units derived from an acid anhydride monomer, and (D) 150 to 1000 parts by weight of units derived from a (meth)acrylate monomer, and an optical film including the resin composition and having reverse wavelength dispersion characteristics.

17 Claims, No Drawings

US 9,088,009 B2

RESIN COMPOSITION, OPTICAL FILM AND ORGANIC LIGHT EMITTING DISPLAY DEVICE

This application is a 35 USC §371 National Stage entry of International Application No. PCT/KR2013/008498, filed on Sep. 23, 2013, which claims priority of Korean Application No. 10-2013-0033790, filed on Mar. 28, 2013, and Korean Application No. 10-2013-0112585, filed on Sep. 23, 2013 all of which are hereby incorporated by reference in their entirety.

TECHNICAL FIELD

The present disclosure relates to a resin composition and an optical film including the same and having reverse wavelength dispersion characteristics, and more particularly, to a resin composition for manufacturing an optical film having wavelength dispersion characteristics in which an in-plane retardation value is decreased in accordance with a reduction in wavelengths of light, and an optical film including the same.

BACKGROUND ART

Currently commercialized organic light emitting diodes (OLED) panels have been prominent due to an excellent contrast ratio, a low degree of heat being generated therein, a thin and lightweight exterior and the like. The definition of the screen of the panel may be determined by increasing a difference in contrasts between dark portions and bright portions of the screen to allow the dark portions to have a greater degree of darkness and the bright portions to have a greater degree of brightness.

In general, in the case of liquid crystal displays (LCD) using liquid crystals, since a contrast ratio may be controlled by interposing two polarizing plates having polarizer elements arranged to be perpendicular to each other, between the liquid crystals, in a state in which a light emitting portion is constantly turned on, limitations in implementing a completely black screen have been present therein. However, since the OLED panel may itself be turned off in order to realize dark portions in a screen thereof, it may be considered to be closer to a black panel, as compared to a general LCD. However, this may be enabled in a case in which light introduced to the panel from the outside is effectively blocked. That is, external light may pass through peripheral portions of a polarizing plate to become linearly polarized light oriented in a single direction and then, the linearly polarized light may pass through a ¼ wavelength plate and be converted into a circular polarized light. Through such variations of light, in a case in which external light is introduced into the OLED panel, the light may be blocked from being emitted from the panel to thereby realize a black panel. Therefore, currently used OLED panels may necessarily require a ¼ wavelength plate in order to adjust visual characteristics of a screen thereof.

When the linearly polarized light passes through the ¼ wavelength plate, whether or not a perfectly circular polarization is implemented may be mainly determined depending on the ¼ wavelength plate. To this end, an in-plane retardation value of the ¼ wavelength plate may be designed to be about 140 nm at a reference wavelength of 550 nm in the visible light region. However, in order to provide perfectly circular polarization in the overall wavelengths of 400 nm to 750 nm in the visible light region, the in-plane retardation value may need to be about 100 nm at a wavelength of 400 nm and about 180 nm at a wavelength of 750 nm.

However, since a general polymer such as polycarbonate, a polycycloolefin or the like, commonly used for the ¼ wavelength plate in the related art, may have wavelength dispersion characteristics in which birefringence is greater in accordance with a reduction in wavelengths of light, that is, positive wavelength dispersion characteristics, it may be inappropriate to be used in the ¼ wavelength plate.

Therefore, as a method of controlling a wavelength in the overall visible light region, a method of stacking two or more birefringent films having different retardation wavelength dependences, at a certain angle, has been known. However, such a method may require a process of attaching a plurality of retardation films, a process of adjusting an angle at which the retardation film is attached, and the like, thereby leading to defects in productivity. In addition, since an overall thickness of the retardation film is increased, visible light transmittance may be degraded to cause darkness.

Recently, a method of controlling a wavelength in a broad band by using a single sheet of film, without the stacking described above, has been proposed. That is, a method of using a polycarbonate copolymer formed of a unit having positive refractive index anisotropy and a unit having negative refractive index anisotropy. However, since the polycarbonate copolymer contains a unit derived from bisphenol fluorine, it may have limitations such as a high melting temperature or susceptibility to gellification due to decomposition during melting processing. In addition, the polycarbonate copolymer may be defective in that a glass transition temperature (Tg) is relatively high, and a high temperature is required for a film stretching process, such that specific processing equipment different from that of the related art may be necessary.

In addition, a method of manufacturing a retardation film, using a polycarbonate copolymer containing fluorene rings and Isosorbide components, has been suggested. However, since the polycarbonate copolymer has low thermal stability, it may be inappropriate for use in a process such as melting processing or the like.

Therefore, the development of a resin composition used for manufacturing an optical film having reverse wavelength dispersion characteristics, while being easily manufactured may be urgently required.

DISCLOSURE

Technical Problem

An aspect of the present disclosure provides a resin composition used for manufacturing an optical film having reverse wavelength dispersion characteristics as well as having high degrees of visible light transmittance and thermal stability, while being easily manufactured, and an optical film including the same.

Technical Solution

According to an aspect of the present disclosure, there is provided a resin composition including a copolymer including: (A) 100 parts by weight of units derived from a polycyclic aromatic monomer including a vinyl group; (B) 100 to 600 parts by weight of units derived from a styrene monomer; (C) 100 to 600 parts by weight of units derived from an acid anhydride monomer; and (D) 150 to 1000 parts by weight of units derived from a (meth)acrylate monomer.

According to another aspect of the present disclosure, there is provided an optical film including the resin composition and having reverse wavelength dispersion characteristics in a wavelength region of 380 nm to 770 nm.

According to another aspect of the present disclosure, there is provided an organic light emitting display device having a reflective plate, an OLED panel, the optical film, and a polarizing plate stacked sequentially.

Advantageous Effects

The resin composition according to exemplary embodiments of the present disclosure may be easily manufactured, and an optical film including the resin composition may have reverse wavelength dispersion characteristics as well as having high degrees of visible light transmittance and thermal stability, such that they may be suitable for the ¼ wavelength plate.

BEST MODE

Hereinafter, exemplary embodiments of the present disclosure will be described. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

As a result of repeated research in order to solve the objects described above, the inventors of the present disclosure found that in the case of manufacturing a resin composition by copolymerizing specific monomers among monomers having negative intrinsic birefringence and monomers having positive intrinsic birefringence, and manufacturing an optical film including the resin composition, an optical film having wavelength dispersion characteristics in which an in-plane retardation value is decreased in accordance with a reduction in wavelengths of light, that is, reverse wavelength dispersion characteristics, may be obtained, to thereby complete the disclosure.

A resin composition according to an exemplary embodiment of the present disclosure may include: a copolymer including (A) 100 parts by weight of units derived from a polycyclic aromatic monomer including a vinyl group; (B) 100 to 600 parts by weight of units derived from a styrene monomer; (C) 100 to 600 parts by weight of units derived from an acid anhydride monomer; and (D) 150 to 1000 parts by weight of units derived from a (meth)acrylate monomer.

In this case, the (A) units and the (B) units may be derived from the monomers having negative intrinsic birefringence, and the (C) units and the (D) units may be derived from the monomers having positive intrinsic birefringence. In this case, the negative intrinsic birefringence may refer to the exhibition of retardation in a direction perpendicular to a stretching direction when homopolymers of monomers are stretched, and the positive intrinsic birefringence may refer to the exhibition of retardation in the stretching direction when the homopolymers of the monomers are stretched.

Meanwhile, in the case of manufacturing an optical film using the copolymer including the units derived from the monomers having negative intrinsic birefringence and the units derived from the monomers having positive intrinsic birefringence as described above, birefringence exhibited by the units having negative intrinsic birefringence and birefringence exhibited by the units having positive intrinsic birefringence after the stretching thereof may be offset from each other to cause wavelength dispersion characteristics. According to the inventors' research, it could be confirmed that when the content of the units having negative intrinsic birefringence and the content of the units having positive intrinsic birefringence satisfy the numerical range, an optical film having reverse wavelength dispersion characteristics may be manufactured.

Meanwhile, the polycyclic aromatic monomer including the vinyl group may be a two-ring or three-ring aromatic monomer substituted with the vinyl group, and for example, may be at least one selected from a group consisting of vinylnaphthalene, vinylcarbazole, a vinyl fluorene compound, vinyl anthracene and the like. Since the polycyclic aromatic monomer including the vinyl group may have a polycyclic structure, a glass transition temperature of the copolymer including the polycyclic aromatic monomer and the resin composition including the copolymer may be increased, such that an optical film having a high degree of heat resistance may be manufactured. Therefore, in a case in which a polarizing plate is manufactured using the optical film, the polarizing plate may be advantageous in a process requiring high temperature such as a polarizing plate lamination process or the like.

In particular, in the present disclosure, the (A) units may be derived from vinylnaphthalene represented by the following [Chemical Formula 1] or N-vinylcarbazole represented by the following [Chemical Formula 2].

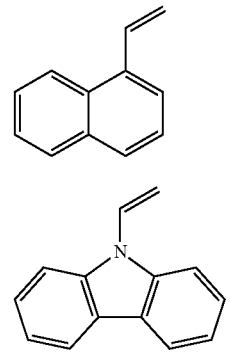

[Chemical Formula 1]

[Chemical Formula 2]

Meanwhile, the styrene monomer may be substituted or unsubstituted styrene and for example, may be styrene; $c_{1-10}$ alkyl styrene such as alpha-methyl styrene, ethyl styrene, butyl styrene, or dodecyl styrene; dialkyl styrene such as dimethylstyrene; hydroxyl styrene, or the like. The styrene monomer may have negative birefringence in the same manner as the (A) units, may serve to help a smooth copolymerization reaction with the acid anhydride monomer to be described later, and may enhance processability of the overall resin.

In particular, in the resin composition according to the exemplary embodiment of the present disclosure, the (B) units may be derived from the unsubstituted styrene. The reason for this is because the unsubstituted styrene may be easily obtained as compared to other styrene monomers, may have no adverse effect on a resin color, and may not cause degradation in terms of heat resistance.

Then, as the acid anhydride monomer, an acid anhydride monomer having positive birefringence may be used without limitations. More preferably, an acid anhydride monomer having a ring structure may be used. By way of example, the acid anhydride monomer may be at least one selected from a group consisting of phthalic anhydride and maleic anhydride.

In the case of using the acid anhydride monomer having a ring structure as described above, the acid anhydride monomer may have positive birefringence and the overall resin may have increased heat resistance.

In particular, in the resin composition according to the exemplary embodiment of the present disclosure, the (C) units may be derived from maleic anhydride. The reason for this is because maleic anhydride may be easily obtained and in the case in which the resin composition includes maleic anhydride, a stable reaction may be undertaken.

As the (meth)acrylate monomer, a (meth)acrylate monomer having positive birefringence may be used without limitations. By way of example, the (meth)acrylate monomer may be at least one selected from a group consisting of $C_{1\sim5}$ alkyl(meth)acrylate such as methyl(meth)acrylate, ethyl (meth)acrylate or butyl(meth)acrylate; $C_{5\sim10}$ cycloalkyl (meth)acrylate such as cyclohexyl(meth)acrylate; aromatic (meth)acrylate such as phenyl(meth)acrylate, phenoxy(meth) acrylate or the like. Since the (meth)acrylate monomer has positive birefringence characteristics, but exhibit a low birefringence ratio, they may not significantly affect the birefringence of the overall resin, and may control the heat resistance thereof, thereby facilitating the processing thereof.

In particular, in the resin composition according to the exemplary embodiment of the present disclosure, the (D) units may be derived from methyl(meth)acrylate. The reason for this is because methyl(meth)acrylate has a high degree of heat resistance and good color and is able to easily react with other monomers.

Meanwhile, in order to enable the optical film manufactured using the resin composition according to the embodiment of the present disclosure to have reverse wavelength dispersion characteristics, the contents of the respective units included in the copolymer may be appropriately adjusted.

More particularly, in the resin composition according to the exemplary embodiment of the present disclosure, the (A) units derived from the polycyclic aromatic monomer including the vinyl group may be included in an amount of about 5 to 20 parts by weight or in an amount of about 8 to 20 parts by weight, based on 100 parts by weight of the copolymer. When the amount of the (A) units is outside of the numerical range, the securing of the reverse wavelength dispersion characteristics may be difficult, a copolymerization reaction between the monomers may not be smoothly undertaken, and production costs may be increased.

In addition, the (B) units derived from the styrene monomer may be included in an amount of 100 to 600 parts by weight or in an amount of 100 to 375 parts by weight, based on 100 parts by weight of the (A) units. When the amount of the (B) units is outside of the numerical range, the copolymerization with the (C) units may not be smoothly generated, thereby leading to a lowering in heat resistance.

Further, the (C) units derived from the acid anhydride monomer may be included in an amount of 100 to 600 parts by weight or in an amount of 100 to 375 parts by weight, based on 100 parts by weight of the (A) units. When the amount of the (C) units is outside of the numerical range, the securing of reverse wavelength dispersion characteristics may be difficult.

Furthermore, the (D) units may be included in an amount of 150 to 1000 parts by weight or in an amount of 150 to 625 parts by weight, based on 100 parts by weight of the (A) units. When the amount of the (D) units satisfies the numerical range, desired retardation characteristics may be easily controlled and excellent transparency may be exhibited.

Meanwhile, in the copolymer according to the exemplary embodiment of the present disclosure, a ratio of the sum of the amounts of the units having negative birefringence to the sum of the amounts of the units having positive birefringence, that is, a ratio of the sum of the amounts of the (A) units and the (B) units having negative birefringence to the sum of the amounts of the (C) units and the (D) units having positive birefringence, may be about 1:3 to 2:3. When the amounts of the units included in the copolymer satisfy the numerical ranges, further excellent reverse wavelength dispersion characteristics may be secured.

The copolymer according to the exemplary embodiment of the present disclosure may include repeating units each represented by the following [Chemical Formula 3] to [Chemical Formula 6].

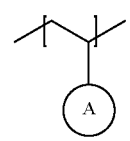

[Chemical Formula 3]

Here, A represents naphthalene, carbazole, fluorene, or anthracene, and preferably, represents naphthalene or carbazole.

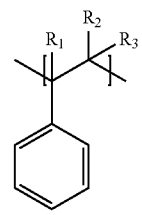

[Chemical Formula 4]

Here, $R_1$, $R_2$ and $R_3$ each represents hydrogen, $C_{1\sim10}$ alkyl, or hydroxyl, preferably, hydrogen.

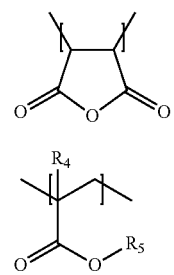

[Chemical Formula 5]

[Chemical Formula 6]

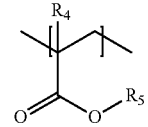

Here, $R_4$ is hydrogen or methyl and $R_5$ is hydrogen, $c_{1\sim5}$ alkyl, $C_{5\sim10}$ cycloalkyl, phenyl or phenoxy and preferably, $R_4$ is methyl and $R_5$ is hydrogen.

Meanwhile, the glass transition temperature of the copolymer may be 110° C. to 160° C. or 120° C. to 150° C. When the glass transition temperature of the copolymer satisfies the numerical range, a resin formed using the copolymer may not be easily damaged due to heat and may be easily applied to a process such as a melting process during the manufacturing of an optical film.

Further, a weight average molecular weight of the copolymer may be 70,000 to 150,000 in terms of heat resistance, a sufficient processability, and productivity.

As needed, the resin composition according to the exemplary embodiment of the present disclosure may further include other components in addition to the copolymer, for example, an additive such as an ultraviolet absorber, an antioxidant, a filler or the like, a compatibilizer, a stabilizer, or the like.

Next, the optical film according to the exemplary embodiment of the present disclosure will be described.

The optical film according to the exemplary embodiment of the present disclosure may be manufactured by using the resin composition according to the exemplary embodiment of the present disclosure, and may have reverse wavelength dispersion characteristics in a wavelength region of 380 nm to 770 nm.

More particularly, the optical film according to the exemplary embodiment of the present disclosure may be manufactured by a film manufacturing method commonly known in the related art, for example, a solution casting method, a melt extrusion method, a thermal pressing method, a calendar method or the like, using the resin composition according to the exemplary embodiment of the present disclosure. In particular, the optical film according to the exemplary embodiment of the present disclosure may be manufactured by a melt extrusion method in terms of productivity. In some cases, an additive such as an improver may be added to the film during the manufacturing of the film, as long as it does not adversely affect properties thereof, and a uniaxial or biaxial stretching process may be additionally performed.

In this case, a stretching temperature may be within a range close to a glass transition temperature of a thermoplastic resin composition, a film raw material. The stretching temperature may be (glass transition temperature−30° C.) to (glass transition temperature+100° C.) and preferably, (glass transition temperature−20° C.) to (glass transition temperature+80° C.). When the stretching temperature is less than (glass transition temperature−30° C.), a sufficient stretching ratio may not be obtained. On the contrary to this, when the stretching temperature is greater than (glass transition temperature+100° C.), the fluxion (flow) of the resin composition may be generated, such that stretching may not be stably performed.

The optical film according to the exemplary embodiment of the present disclosure manufactured using the resin composition of the present disclosure as described above may have reverse wavelength dispersion characteristics, and more particularly, satisfies the following Equations (2) and (3).

$$R_{in}(450)/R_{in}(550) < 1.0 \qquad \text{Equation (2)}$$

$$R_{in}(650)/R_{in}(550) > 1.0 \qquad \text{Equation (3)}$$

Here, $R_{in}(450)$, $R_{in}(550)$, and $R_{in}(650)$ may refer to in-plane retardation values ($R_{in}$) of the film at wavelengths of 450 nm, 550 nm, and 650 nm, respectively. In this case, the in-plane retardation value $R_{in}(\lambda)$ may be defined by the following Equation (1).

$$R_{in}(\lambda) = (n_x - n_y) \times d \qquad \text{Equation (1)}$$

Here, $\lambda$ is measured wavelength, $n_x$ is an in-plane refractive index of the film in a direction having the largest refractive index, $n_y$ is an in-plane refractive index of the film in a direction perpendicular to the direction of $n_x$, and d is a thickness of the film.

Meanwhile, an in-plane retardation value $R_{in}(450)$ of the optical film according to the exemplary embodiment of the present disclosure at a wavelength of 450 nm may be about 105 nm to 130 nm, 107 nm to 120 nm, or 110 nm to 115 nm. Further, an in-plane retardation value $R_{in}(550)$ of the optical film according to the exemplary embodiment of the present disclosure at a wavelength of 550 nm may be about 130 nm to 144 nm or 135 nm to 140 nm. Furthermore, an in-plane retardation value $R_{in}(650)$ of the optical film according to the exemplary embodiment of the present disclosure at a wavelength of 650 nm may be about 140 nm to 170 nm, 150 nm to 170 nm, or 160 nm to 165 nm.

In addition, a value of $R_{in}(450)/R_{in}(550)$ of the optical film may be about 0.7 to 0.95, 0.75 to 0.9, or 0.8 to 0.89. A value of $R_{in}(650)/R_{in}(550)$ of the optical film may be about 1.03 to 1.3, 1.05 to 1.25, or 1.07 to 1.2.

When values of $R_{in}(450)$, $R_{in}(550)$, $R_{in}(650)$ of the optical film satisfy the numerical ranges, linearly polarized light may be converted into ideal circular polarized light in overall wavelengths of visible light.

Meanwhile, a thickness of the optical film according to the exemplary embodiment of the present disclosure may range from 20 μm to 80 μm or 30 μm to 60 μm. In this case, the thickness of the optical film may refer to a thickness of the film finally obtained after stretching thereof. When the thickness of the optical film is within the numerical range, the thinning of a polarizing plate and desired circular polarization characteristics may be obtained. In addition, a haze value of the optical film according to the exemplary embodiment of the present disclosure may be equal to or less than 0.5, preferably, equal to or less than 0.3.

In addition, the optical film according to the exemplary embodiment of the present disclosure may have excellent visible light transmittance. For example, the optical film according to the exemplary embodiment of the present disclosure may have a visible light transmittance of 90% or more. Thus, the optical film according to the exemplary embodiment of the present disclosure having visible light transmittance as described above may be advantageous in that visual characteristics thereof may be excellent.

Since the optical film according to the exemplary embodiment of the present disclosure may be formed of a single layer and have reverse wavelength dispersion characteristics, the thinning of the film may be implemented while desired optical characteristics may be obtained. In addition, an image display device including the optical film may have advantages such as in the miniaturization and weight reduction thereof. Further, as compared to the case of the related art in which an optical film having reverse wavelength dispersion characteristics is manufactured by stacking a plurality of layers, a process of adjusting an angle at which the respective layers are attached may not be required, thereby leading to high productivity, in the manufacturing of the optical film according to the exemplary embodiment of the present disclosure.

The optical film according to the exemplary embodiment of the present disclosure as described above may be used for various usages and for example, may be usefully employed in a retardation film, a ¼ wavelength plate, and the like. In particular, the optical film according to the exemplary embodiment of the present disclosure may be usefully employed in a ¼ wavelength plate for an organic light emitting diode (OLED). In this case, the optical film may be disposed between an OLED panel and a polarizing plate. That is, an organic light emitting display device according to the exemplary embodiment of the present disclosure may have a structure in which a reflective plate, an OLED panel, the optical film according to the exemplary embodiment of the present disclosure, and a polarizing plate are stacked sequentially.

MODE FOR DISCLOSURE

Hereinafter, the present disclosure will be described in detail through concrete examples.

In the embodiment of the present disclosure, physical properties evaluation methods are as below.

1. Weight average molecular weight (Mw): Measured using gel permeation chromatography (GPC) by melting manufactured resin in tetrahydrofuran.
2. Tg (glass transition temperature): Measured using a differential scanning calorimeter (DSC) by TA Instrument Co., Ltd.
3. Retardation Value: Measured using AxoScan by Axometrics. Inc. after films were stretched at a glass transition temperature thereof.
4. Haze Value (Transparency): Measured haze values using HAZEMETER HM-150 by Murakami color Research Laboratory. Co. ltd.

Inventive Example 1

Resin was manufactured by copolymerizing 8 parts by weight of vinylnaphthalene, 22 parts by weight of maleic anhydride, 20 parts by weight of styrene, and 50 parts by weight of methylmethacrylate. The manufactured copolymer had a weight average molecular weight of 120,000 and a glass transition temperature thereof was 136° C.

Then, after a non-stretched film having a width of 1500 nm was fabricated using the resin with a T-die film-forming apparatus under conditions of 250° C. and 250 rpm, the film was uniaxially stretched in a TD direction at the glass transition temperature and a retardation value of the film was measured. In this case, a haze value of the film was 0.2.

Inventive Example 2

Resin was manufactured by copolymerizing 10 parts by weight of vinylnaphthalene, 25 parts by weight of maleic anhydride, 20 parts by weight of styrene, and 45 parts by weight of methylmethacrylate. The manufactured copolymer had a weight average molecular weight of 120,000 and a glass transition temperature thereof was 141° C.

Then, after a non-stretched film having a width of 1500 nm was fabricated using the resin with a T-die film-forming apparatus under conditions of 280° C. and 250 rpm, the film was uniaxially stretched in a TD direction at the glass transition temperature and a retardation value of the film was measured. In this case, a haze value of the film was 0.2.

Inventive Example 3

Resin was manufactured by copolymerizing 10 parts by weight of vinylnaphthalene, 25 parts by weight of maleic anhydride, 30 parts by weight of styrene, and 35 parts by weight of methylmethacrylate. The manufactured copolymer had a weight average molecular weight of 120,000 and a glass transition temperature thereof was 135° C.

Then, after a non-stretched film having a width of 1500 nm was fabricated using the resin with a T-die film-forming apparatus under conditions of 250° C. and 250 rpm, the film was uniaxially stretched in a TD direction at the glass transition temperature and a retardation value of the film was measured. In this case, a haze value of the film was 0.2.

Inventive Example 4

Resin was manufactured by copolymerizing 20 parts by weight of vinylnaphthalene, 30 parts by weight of maleic anhydride, 20 parts by weight of styrene, and 30 parts by weight of methylmethacrylate. The manufactured copolymer had a weight average molecular weight of 130,000 and a glass transition temperature thereof was 146° C.

Then, after a non-stretched film having a width of 1500 nm was fabricated using the resin with a T-die film-forming apparatus under conditions of 280° C. and 250 rpm, the film was uniaxially stretched in a TD direction at the glass transition temperature and a retardation value of the film was measured. In this case, a haze value of the film was 0.2.

Inventive Example 5

Resin was manufactured by copolymerizing 5 parts by weight of vinylnaphthalene, 20 parts by weight of maleic anhydride, 30 parts by weight of styrene, and 45 parts by weight of methylmethacrylate. The manufactured copolymer had a weight average molecular weight of 115,000 and a glass transition temperature thereof was 132° C.

Then, after a non-stretched film having a width of 1500 nm was fabricated using the resin with a T-die film-forming apparatus under conditions of 280° C. and 250 rpm, the film was uniaxially stretched in a TD direction at the glass transition temperature and a retardation value of the film was measured. In this case, a haze value of the film was 0.2.

Inventive Example 6

Resin was manufactured by copolymerizing 5 parts by weight of N-vinylcarbazole, 22 parts by weight of maleic anhydride, 23 parts by weight of styrene, and 50 parts by weight of methylmethacrylate. The manufactured copolymer had a weight average molecular weight of 130,000 and a glass transition temperature thereof was 143° C.

Then, after a non-stretched film having a width of 1500 nm was fabricated using the resin with a T-die film-forming apparatus under conditions of 280° C. and 250 rpm, the film was uniaxially stretched in a TD direction at the glass transition temperature and a retardation value of the film was measured. In this case, a haze value of the film was 0.2.

Comparative Example 1

Resin was manufactured by copolymerizing 30 parts by weight of maleic anhydride, 40 parts by weight of styrene, and 30 parts by weight of methylmethacrylate. The manufactured copolymer had a weight average molecular weight of 130,000 and a glass transition temperature thereof was 131° C.

Then, after a non-stretched film having a width of 1500 nm was fabricated using the resin with a T-die film-forming apparatus under conditions of 280° C. and 250 rpm, the film was uniaxially stretched in a TD direction at the glass transition temperature and a retardation value of the film was measured. In this case, a haze value of the film was 0.2.

Comparative Example 2

Resin was manufactured by copolymerizing 10 parts by weight of vinylnaphthalene, 10 parts by weight of maleic anhydride, 5 parts by weight of styrene, and 75 parts by weight of methylmethacrylate. The manufactured copolymer had a weight average molecular weight of 130,000 and a glass transition temperature thereof was 131° C.

Then, after a non-stretched film having a width of 1500 nm was fabricated using the resin with a T-die film-forming apparatus under conditions of 280° C. and 250 rpm, the film was uniaxially stretched in a TD direction at the glass transition temperature and a retardation value of the film was measured. In this case, a haze value of the film was 0.2.

Comparative Example 3

Resin was manufactured by copolymerizing 3 parts by weight of vinylnaphthalene, 10 parts by weight of maleic anhydride, 20 parts by weight of styrene, and 67 parts by weight of methylmethacrylate. The manufactured copolymer had a weight average molecular weight of 120,000 and a glass transition temperature thereof was 124° C.

Then, after a non-stretched film having a width of 1500 nm was fabricated using the resin with a T-die film-forming apparatus under conditions of 280° C. and 250 rpm, the film was uniaxially stretched in a TD direction at the glass transition temperature and a retardation value of the film was measured. In this case, a haze value of the film was 0.2.

Experimental Example 1

The results of in-plane retardation values of the optical films manufactured according to Inventive Examples 1 to 6 and Comparative Examples 1 to 3, measured at respective wavelengths were shown in Table 1. All retardation values at different wavelengths were measured at a fixed stretching ratio used when an in-plane retardation value of a film having a thickness of 60 μm after the stretching of the film, was 137 nm at a wavelength of 550 nm. In all experimental ranges, the films were transparent, having a visible light transmittance of 91% or more.

TABLE 1

| Classification | | 450 nm | 550 nm | 650 nm |
|---|---|---|---|---|
| Inventive Example 1 | In-plane retardation | 122 | 137 | 147 |
| | $R_\lambda/R_{550}$ | 0.89 | 1.00 | 1.07 |
| Inventive Example 2 | In-plane retardation | 118 | 137 | 152 |
| | $R_\lambda/R_{550}$ | 0.86 | 1.00 | 1.11 |
| Inventive Example 3 | In-plane retardation | 118 | 137 | 150 |
| | $R_\lambda/R_{550}$ | 0.86 | 1.00 | 1.11 |
| Inventive Example 4 | In-plane retardation | 115 | 137 | 157 |
| | $R_\lambda/R_{550}$ | 0.84 | 1.00 | 1.14 |
| Inventive Example 5 | In-plane retardation | 125 | 137 | 147 |
| | $R_\lambda/R_{550}$ | 0.91 | 1.00 | 1.07 |
| Inventive Example 6 | In-plane retardation | 120 | 137 | 143 |
| | $R_\lambda/R_{550}$ | 0.88 | 1.00 | 1.04 |
| Comparative Example 1 | In-plane retardation | 156 | 137 | 120 |
| | $R_\lambda/R_{550}$ | 1.14 | 1.00 | 0.88 |
| Comparative Example 2 | In-plane retardation | 149 | 137 | 122 |
| | $R_\lambda/R_{550}$ | 1.08 | 1.00 | 0.89 |
| Comparative Example 3 | In-plane retardation | 148 | 137 | 132 |
| | $R_\lambda/R_{550}$ | 1.08 | 1.00 | 0.96 |

While the present disclosure has been shown and described in connection with the embodiments, it will be apparent to those skilled in the art that modifications and variations can be made without departing from the spirit and scope of the disclosure as defined by the appended claims.

The invention claimed is:

1. A resin composition comprising a copolymer including:
   (A) 100 parts by weight of units derived from a polycyclic aromatic monomer including a vinyl group;
   (B) 100 to 600 parts by weight of units derived from a styrene monomer;
   (C) 100 to 600 parts by weight of units derived from an acid anhydride monomer; and
   (D) 150 to 1000 parts by weight of units derived from a (meth)acrylate monomer.

2. The resin composition of claim 1, wherein in the copolymer, (sum of the amounts of the (A) units and the (B) units): (sum of the amounts of the (C) units and the (D) units) is 1:3 to 2:3.

3. The resin composition of claim 1, wherein the polycyclic aromatic monomer including the vinyl group is at least one selected from a group consisting of vinylnaphthalene, N-vinylcarbazole, a vinyl fluorene compound, and vinyl anthracene.

4. The resin composition of claim 1, wherein the styrene monomer is at least one selected from a group consisting of alpha-methyl styrene, ethyl styrene, butyl styrene, hydroxyl styrene, dimethyl styrene, and dodecyl styrene.

5. The resin composition of claim 1, wherein the acid anhydride monomer is at least one selected from a group consisting of phthalic anhydride and maleic anhydride.

6. The resin composition of claim 1, wherein the (meth) acrylate monomer is at least one selected from a group consisting of methylmethacrylate, cyclohexyl methacrylate, phenyl methacrylate, butyl acrylate, phenoxy methacrylate, and ethyl acrylate.

7. The resin composition of claim 1, wherein a glass transition temperature of the copolymer is 110° C. to 160° C.

8. The resin composition of claim 1, wherein a weight average molecular weight of the copolymer is 70,000 to 150,000.

9. An optical film comprising the resin composition of claim 1, and having reverse wavelength dispersion characteristics in a wavelength region of 380 nm to 770 nm.

10. The optical film of claim 9, wherein the optical film is a ¼ wavelength plate.

11. The optical film of claim 9, wherein an in-plane retardation value represented by the following Formula (1) at a wavelength of 450 nm in the optical film, is 107 nm to 130 nm, $$R_{in}(\lambda)=(n_x-n_y)\times d \quad \text{Equation (1)}$$

where nx is an in-plane refractive index of the film in a direction having the largest refractive index, $n_y$ is an in-plane refractive index of the film in a direction perpendicular to the direction of $n_x$, and d is a thickness of the film.

12. The optical film of claim 9, wherein an in-plane retardation value of the optical film at a wavelength of 550 nm is 130 nm to 144 nm.

13. The optical film of claim 9, wherein an in-plane retardation value of the optical film at a wavelength of 650 nm is 140 nm to 170 nm.

14. The optical film of claim 9, wherein the optical film satisfies the following Equations (2) and (3), $$R_{in}(450)/R_{in}(550)<1.0 \quad \text{Equation (2)}$$

$$R_{in}(650)/R_{in}(550)>1.0 \quad \text{Equation (3)}$$

where $R_{in}(450)$, $R_{in}(550)$, and $R_{in}(650)$ refer to in-plane retardation values of the film at wavelengths of 450 nm, 550 nm, and 650 nm, respectively.

15. The optical film of claim 9, wherein a value of $R_{in}(450)/R_{in}(550)$ of the optical film is 0.7 to 0.95.

16. The optical film of claim 9, wherein a value of $R_{in}(650)/R_{in}(550)$ of the optical film is 1.03 to 1.3.

17. An organic light emitting display device having a structure in which a reflective plate, an OLED panel, the optical film of claim 9, and a polarizing plate are stacked sequentially.

\* \* \* \* \*